(12) United States Patent
Pellerano et al.

(10) Patent No.: US 8,598,930 B2
(45) Date of Patent: Dec. 3, 2013

(54) DIGITAL DELAY-LOCKED LOOP WITH DRIFT SENSOR

(75) Inventors: Stefano Pellerano, Beaverton, OR (US); Paolo Madoglio, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/995,472

(22) PCT Filed: Aug. 23, 2011

(86) PCT No.: PCT/US2011/048867
§ 371 (c)(1),
(2), (4) Date: Jun. 18, 2013

(87) PCT Pub. No.: WO2013/028181
PCT Pub. Date: Feb. 28, 2013

(65) Prior Publication Data
US 2013/0271194 A1    Oct. 17, 2013

(51) Int. Cl.
*H03L 7/06* (2006.01)
(52) U.S. Cl.
USPC ............... 327/159; 327/149; 327/158
(58) Field of Classification Search
USPC ............................ 327/149, 158, 159
See application file for complete search history.

(56) References Cited

U.S. PATENT DOCUMENTS

| | | | | |
|---|---|---|---|---|
| 6,150,891 | A * | 11/2000 | Welland et al. | 331/25 |
| 6,327,318 | B1 * | 12/2001 | Bhullar et al. | 375/374 |
| 7,603,095 | B2 * | 10/2009 | Yang et al. | 455/260 |
| 7,952,404 | B2 * | 5/2011 | Petrie | 327/158 |
| 2002/0041196 | A1 * | 4/2002 | Demone et al. | 327/158 |
| 2004/0046597 | A1 | 3/2004 | Alon et al. | |
| 2010/0066421 | A1 * | 3/2010 | Geng et al. | 327/159 |
| 2011/0254603 | A1 * | 10/2011 | Kamath et al. | 327/158 |
| 2012/0074998 | A1 * | 3/2012 | Brett et al. | 327/157 |
| 2013/0003483 | A1 * | 1/2013 | Vlasenko et al. | 365/230.02 |
| 2013/0051166 | A1 * | 2/2013 | Ma et al. | 365/194 |
| 2013/0121094 | A1 * | 5/2013 | Zerbe et al. | 365/194 |
| 2013/0135019 | A1 * | 5/2013 | Bhullar et al. | 327/158 |
| 2013/0154703 | A1 * | 6/2013 | Jechoux et al. | 327/159 |

OTHER PUBLICATIONS

International Search Report and Written Opinion mailed Feb. 23, 2012 from International Application No. PCT/US2011/048867.
Mesgarzadeh et al., "A Low-Power Digital DLL-Based Clock Generator in Open-Loop Mode," IEEE Journal of Solid-State Circuits, vol. 44, No. 7, Jul. 2009, pp. 1907-1913.

* cited by examiner

*Primary Examiner* — Adam Houston
(74) *Attorney, Agent, or Firm* — Schwabe, Williamson & Wyatt, P.C.

(57) ABSTRACT

Embodiments of the present disclosure provide methods, systems, and apparatuses related to an open-loop digital delay-locked loop having a drift sensor. Other embodiments may be described and claimed.

20 Claims, 6 Drawing Sheets

DIGITAL DELAY-LOCKED LOOP WITH DRIFT SENSOR

CROSS REFERENCE TO RELATED APPLICATIONS

The present application is a national phase entry under 35 U.S.C. §371 of International Application No. PCT/US2011/048867, filed Aug. 23, 2011, entitled "DIGITAL DELAY-LOCKED LOOP WITH DRIFT SENSOR", which designates the United States of America, the entire content and disclosure of which is hereby incorporated by reference in its entirety.

FIELD

Embodiments of the present disclosure relate to the field of circuits and, more particularly, to a digital delay-locked loop with a drift sensor.

BACKGROUND

Delay-locked loops (DLLs) are typically used to generate multi-phase clock signals from a single phase clock input. DLLs typically include delay line composed of identical delay cells. The input signal and its delayed version are compared by a phase detector. The phase error is used to adjust the delay line until the signals at the phase detector input are aligned. Once the signals are aligned, the total delay of the delay line is equal to one input clock period. If N delay cells are used in the delay line, N phases of the input clock will be available, one at the output of each delay cell.

Digital DLL architectures address various challenges of analog implementations such as, difficulties introduced by charge pump design, charge leakage for the capacitor, flicker noise in the charge pump current, etc. However, performance of the digital DLLs may be compromised by drift in the delay provided by the delay line.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Various logic blocks may be introduced and described in terms of an operation provided by the blocks. These logic blocks may include hardware, software, and/or firmware elements in order to provide the described operations. While some of these logic blocks may be shown with a level of specificity, e.g., providing discrete elements in a set arrangement, other embodiments may employ various modifications of elements/arrangements in order to provide the associated operations within the constraints/objectives of a particular embodiment.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Figure 1:
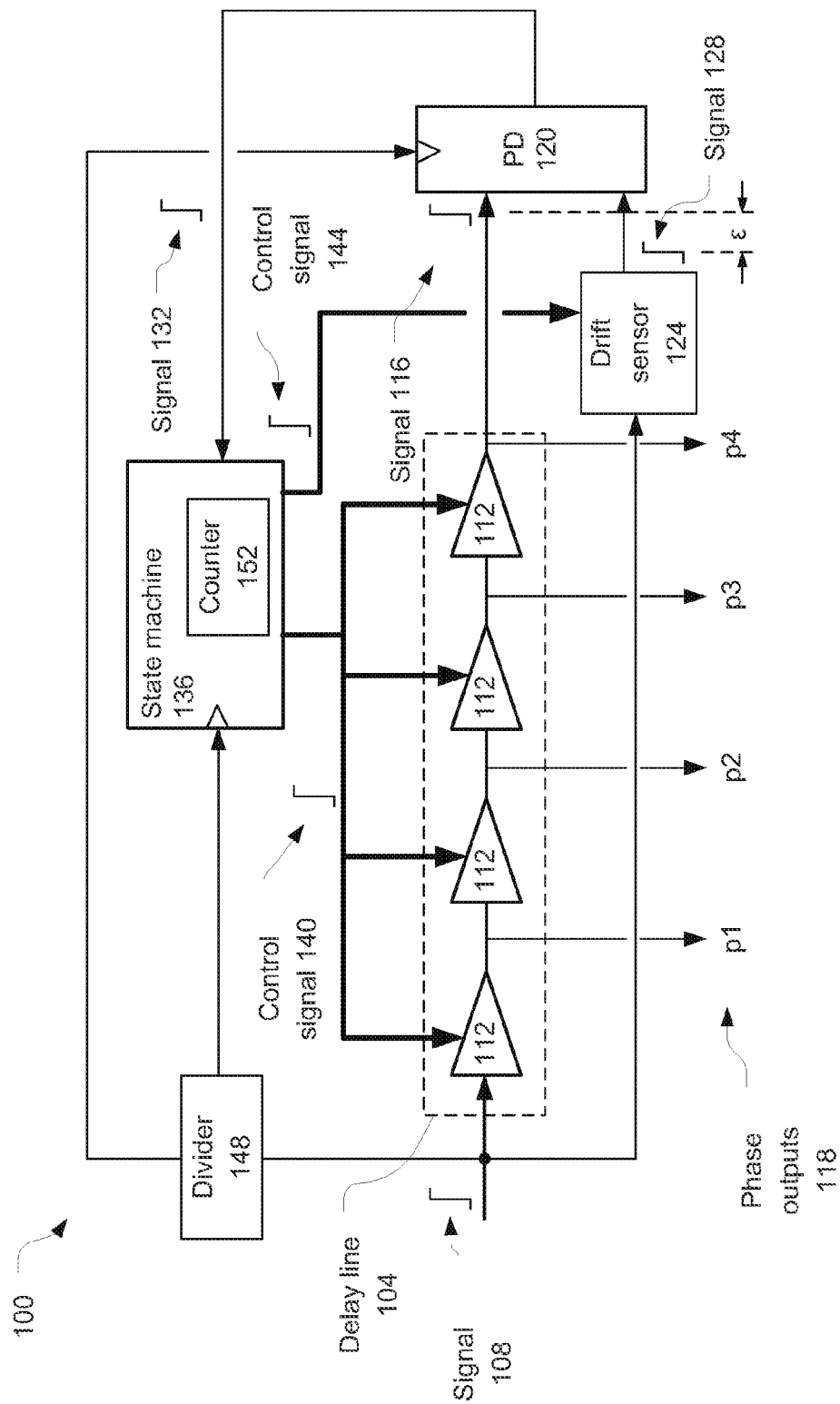
FIG. 1 illustrates a delay-locked loop in accordance with some embodiments.

FIG. 1 illustrates a delay-locked loop (DLL) circuit 100 in accordance with some embodiments. The DLL circuit 100 may include a delay line 104 that is configured to receive a signal 108 from a local oscillator (LO). The delay line 104 may include a plurality of delay elements 112. Each of the plurality of delay elements 112 may provide an incremental, quantized delay to a received signal. The delay line 104 may, therefore, output a signal 116 that is a delayed version of the signal 108. The signal 116 may be provided to a phase detector (PD) 120 as a first phase detector input signal. The delay line 104 may also provide phase outputs (p1-p4) 118 from the individual delay elements 112 that may be used in timing and/or control circuitry of systems incorporating the DLL circuit 100.

The DLL circuit 100 may also include a drift sensor 124. The drift sensor 124 may be coupled in parallel with the delay line 104. The drift sensor 124 may receive signal 108, as a sensor input signal, from the local oscillator and may selectively output, as sensor output signal 128, either signal 108 or a delayed version of the signal 108. The sensor output signal 128 may be provided to the phase detector 120 as a second phase detector input signal.

Figure 2:
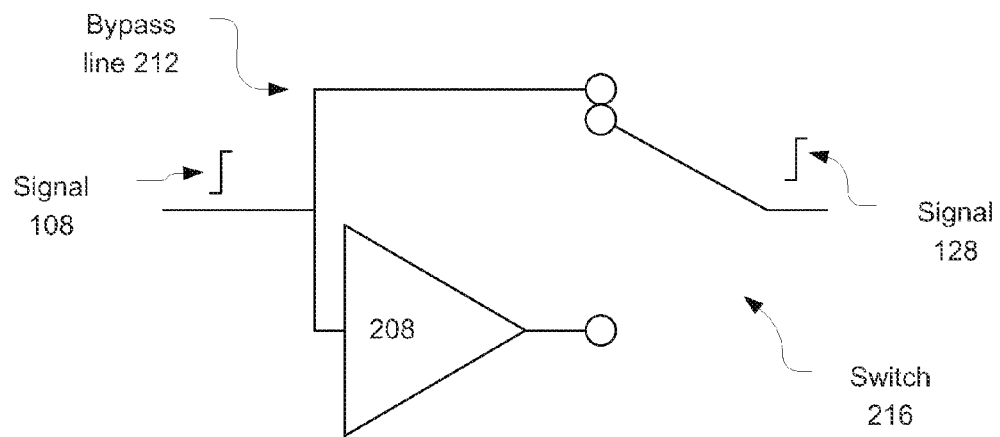
FIG. 2 illustrates a drift sensor in accordance with some embodiments.

FIG. 2 illustrates the drift sensor 124 in accordance with some embodiments. The drift sensor 124 may include a delay element 208, configured to provide a delay of $D_0$, coupled in parallel with a bypass line 212. A switch 216 may operate to selectively couple either the bypass line 212 or the delay element 208 to the output to provide the sensor output signal 128.

The selective output of signal 108 or a delayed version of signal 108 may be done to facilitate the sensing of a drift in the delay line 104 as will be explained below. Drift may occur due to process, voltage, and/or temperature (PVT) variations experienced/exhibited by the components of the DLL circuit 100.

The phase detector 120 may receive both phase detector input signals, e.g., the signal 116 and sensor output signal 128, and output a phase detector signal 132 based on a phase relationship between the phase detector input signals. In the present embodiment, a value of the phase detector signal 132 may indicate whether signal 116 is received before or after sensor output signal 128. In some embodiments, the phase detector 120 may be a simple flip-flop that generates a first value, e.g., 0, to indicate that signal 116 is early (e.g., signal 116 is received at phase detector 120 before sensor output signal 128) and a second value, e.g., 1, to indicate that the signal 116 is late (e.g., signal 116 is received at phase detector 120 after sensor output signal 128). If the signal 116 is early, a phase error may be said to be negative, and vice versa. In various embodiments, other constructions of positive/negative and late/early apply equally well.

The DLL circuit 100 may also include a state machine 136 that is coupled with the phase detector 120, the drift sensor 124, and the delay elements 112 of the delay line 104. The state machine 136 may provide a first digital control signal 140 to the delay line 104, specifically to digital inputs of the delay elements 112, to adjust an amount of delay provided by the delay elements 112.

The state machine 136 may also provide a second digital control signal 144 to the drift sensor 124 to control the switch 216 to selectively output either the signal 108 or delayed version of the signal 108 as sensor output signal 128.

The DLL circuit 100 may also include a divider 148 to create a lower-frequency clock from the signal 108, which may be desirable for proper operation of the phase detector 120 and/or the state machine 136. The divider 148 may be used to keep proper synchronization between the input signal 108 and a phase detector clock.

Figure 3:
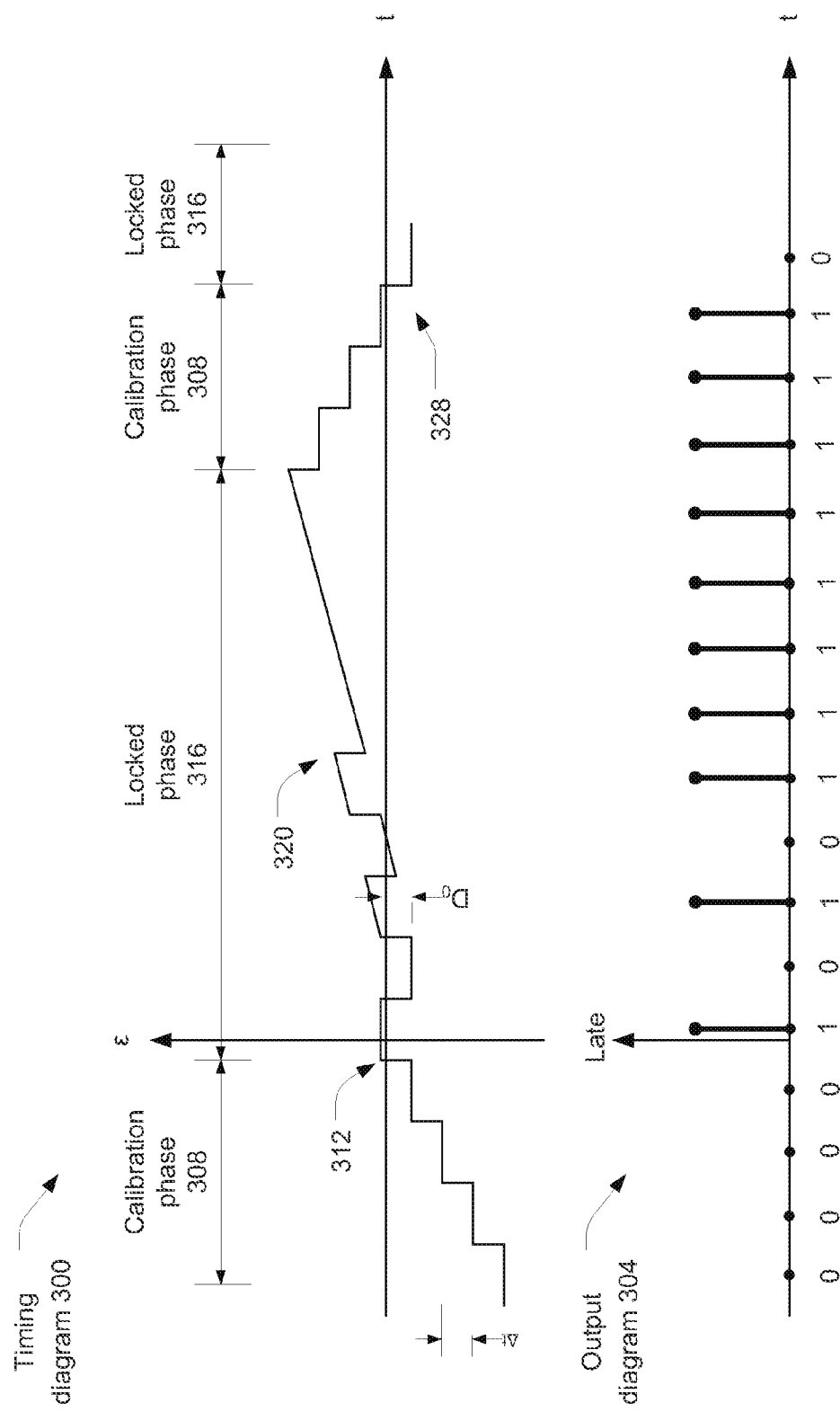
FIG. 3 illustrates timing and output diagrams related to operation of a delay-locked loop in accordance with some embodiments.
Figure 4:
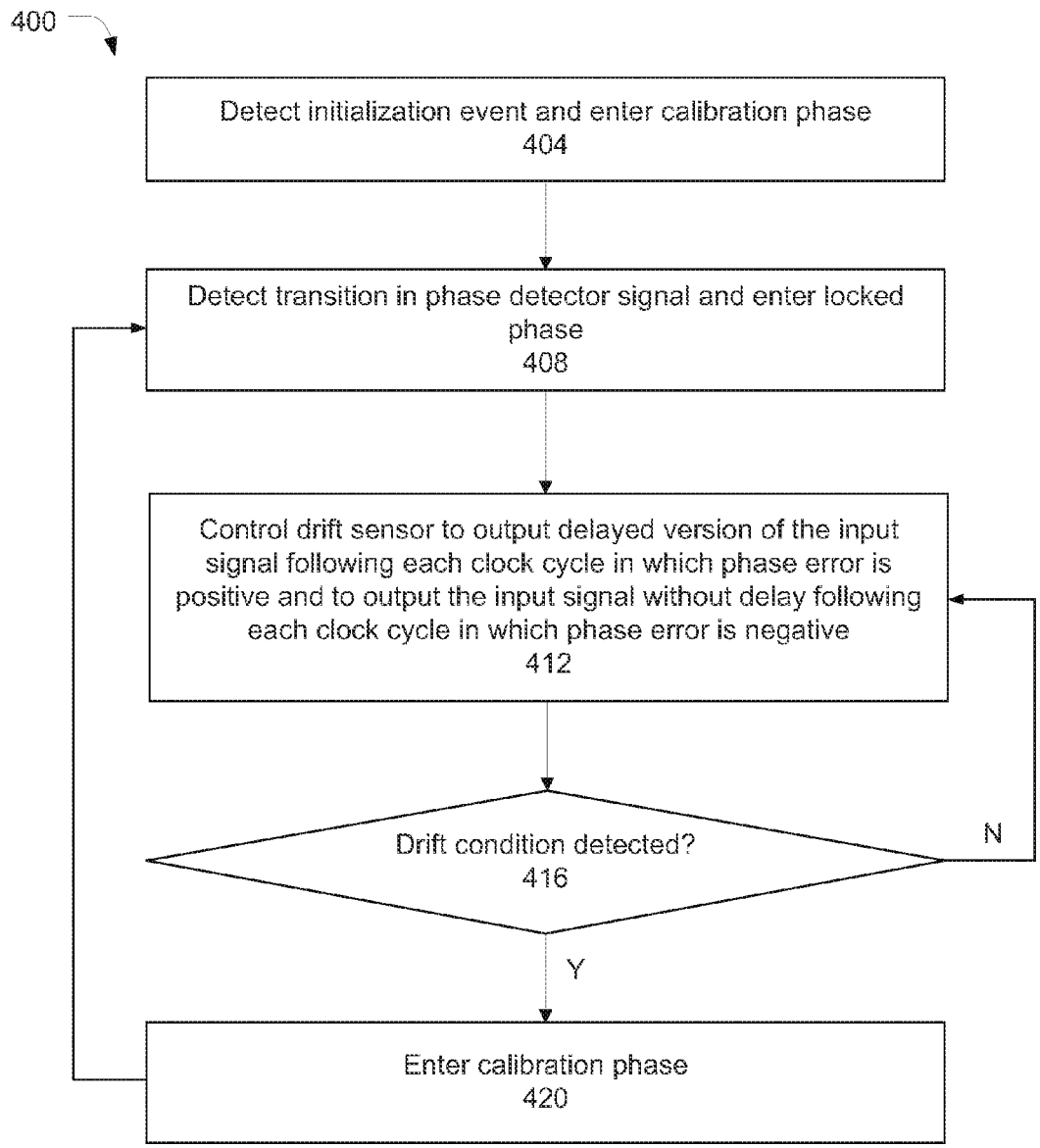
FIG. 4 is a flowchart showing an operation of a delay-locked loop in accordance with some embodiments.

FIG. 3 illustrates various diagrams that may be used to explain operation of DLL circuit 100 in conjunction with the flow diagram 400 of FIG. 4 in accordance with some embodiments. Timing diagram 300 illustrates phase error (ε) at an input of the phase detector 120. Output diagram 304 represents various states of the phase detector signal 132 that correspond to the phase errors of timing diagram 300.

At block 404, the state machine 136 may detect an initiation event, e.g., a power-on, a reset, etc., and may enter into a calibration phase 308. In the initial calibration phase 308, the phase error may be negative, which may result in the phase detector signal 132 having a value of 0, indicating that the signal 116 is early. In response to receipt of the phase detector signal 132 having a 0 value, the state machine 136 may adjust, e.g., increase, a delay provided by the delay line 104 by Δt, which may be the least-significant adjustment interval of the delay line 104. At the next clock cycle, the phase error may still be negative resulting in the phase detector signal 132 having another value of 0, which causes the state machine 136 to adjust the delay line 104 by another Δt.

The incremental adjustment of the calibration phase 308 may continue until, at block 408, the state machine 136 detects a transition in the phase detector signal 132. The phase detector signal 132 may transition to output a 1 value when the phase error becomes positive, at point 312, to indicate that the signal 116 is late. After point 312, the state machine 136 may enter into a locked phase 316, in which the delay of the delay line 104 may be locked. Locking the delay of the delay line 104, as used herein, may mean that the delay is unchanged by the state machine 136.

At block 412, while the state machine 136 is in the locked phase 316, the state machine 136 may control the drift sensor 124 to output the delayed version of the signal 108 as the sensor output signal 128 following each clock cycle in which the phase error is positive. Conversely, the state machine 136 may control the drift sensor 124 to output the signal 108 without delay, via the bypass line 212, as the sensor output signal 128 following each clock cycle in which the phase error is negative. Thus, in the second clock cycle of the locked phase 316, the signal 108 may be delayed by $D_0$, by the drift sensor 124, prior to being provided to the phase detector 120. This may cause the phase error to go negative and, in the following clock cycle, the state machine 136 will then cause the drift sensor 124 to output the signal 108 without delay. This may cause the phase error to go positive.

While the described embodiment shows the drift sensor 124 configured to receive the signal 108 as the sensor input signal, in other embodiments the drift sensor 124 may additionally/alternatively be coupled with and between the delay line 104 and phase detector 120 and may receive signal 116 as the sensor input signal. In such embodiments, the drift sensor 124 may be controlled to output signal 116, with or without an additional delay, as the sensor output signal, which will be a first phase detector input signal, and the signal 108 may be provided directly to the phase detector 120 (in the event a drift sensor is not also placed to receive signal 108 as shown in FIG. 1) as the second phase detector input signal.

At block 416, the state machine 136 may determine whether a drift condition is detected. Detection of the drift condition may be accomplished by monitoring the phase detector signal 132 as follows.

If the delay introduced by the delay line 104 remains unchanged, the $D_0$ delay, which may be equal to or greater than Δt, may be sufficient to cause the phase detector signal 132 to alternate between 0 and 1. However, if the delay introduced by the delay line 104 drifts, while the state machine 136 is in the locked phase 316, the phase error may drift to a point that the addition of $D_o$ does not cause the phase error to switch polarities. See, for example, point 320 in FIG. 3 in which the addition of $D_0$ does not cause the phase error to go negative. After point 320, the phase detector signal 132 may output the same value, e.g., 1, over consecutive clock cycles.

In some embodiments, the state machine 136 may have a counter 152 that is configured to track values of the phase detector signal 132 while in the locked phase 316. The counter 152 may track the values by incrementing every clock cycle in which the phase detector signal is 1 and decrementing every clock cycle in which the phase detector signal is 0. The state machine 136 may compare the counter 152 to a first threshold value to determine whether a positive drift condition is detected; and compare the counter 152 to a second threshold value to determine whether a negative drift condition is detected. In various embodiments, the first and second threshold values may have the same absolute value with opposite polarities, e.g., 5 and −5, in other embodiments, the first and second threshold values may have different absolute values, e.g., 5 and −3. In the described embodiments, the first threshold value may be five and the state machine 136 may determine that a positive drift condition is detected if the counter 152 exceeds the first threshold value. It will be understood that other threshold values and other comparison operations may be used in other embodiments.

If, at block 416, a drift condition is not detected, the operation may loop back to block 412.

If, at block 416, a drift condition is detected, the operation may continue to block 420 and the state machine 136 may again enter the calibration phase 308. Upon entering the calibration phase 308 for the second time, the state machine 136 may incrementally adjust a delay provided by the delay line 104 by Δt until a transition is detected in the phase detector signal 132 at block 408 (and point 328). The incremental adjustment may be an incremental decrease of the delay provided by the delay line 104 if a positive drift condition is detected and an incremental increase of the delay provided by the delay line 104 if a negative drift condition is detected. After point 328, the state machine 136 may again enter into the locked phase 316.

In this manner, the DLL circuit 100 is able to detect and compensate for negative or positive drift in the delay of the delay line 104. It may do this without having to modulate the delay provided by the delay line 104, while in the locked phase, which could result in a degradation of output spectrum.

Figure 5:
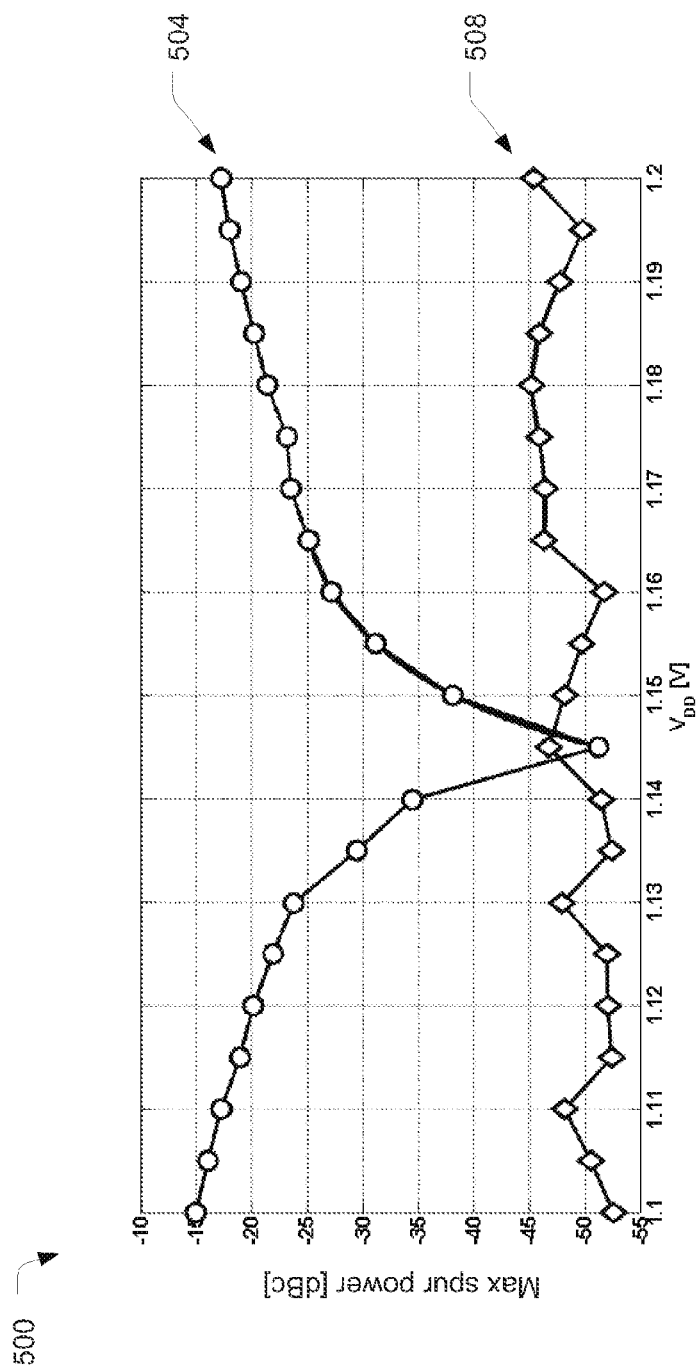
FIG. 5 is a chart relating spur power to power supply voltage in accordance with some embodiments.

FIG. 5 shows a graph 500 representing maximum spur power (spurious free dynamic range (SFDR)) as a function of power supply voltage ($V_{DD}$). The SFDR may provide an indication of phase error in DLL phase outputs, e.g., phase outputs 118 of DLL circuit 100. Line 504 represents SFDR of a DLL locked with a 1.15 volt (V) power supply and then left open-loop without employing the drift detection and compensation described above. As can be seen, the SFDR quickly degrades as the power supply varies from 1.15 V.

Line 508 represents SFDR of a DLL, e.g., DLL circuit 100, employing the drift detection and compensation as described above. As can be seen, the SFDR (and by association, phase error) is insensitive to the power supply variations. The DLL circuit 100 may exhibit similar insensitivity to process and temperature variations.

Embodiments of the present disclosure may be implemented into a system using any suitable hardware and/or software to configure as desired. In some embodiments, the removal of limit-cycle spurs and insensitivity to PVT variations may allow the DLL circuit 100 to produce high signal-spectral purity that is particularly suitable for use in wireless communication systems.

Figure 6:
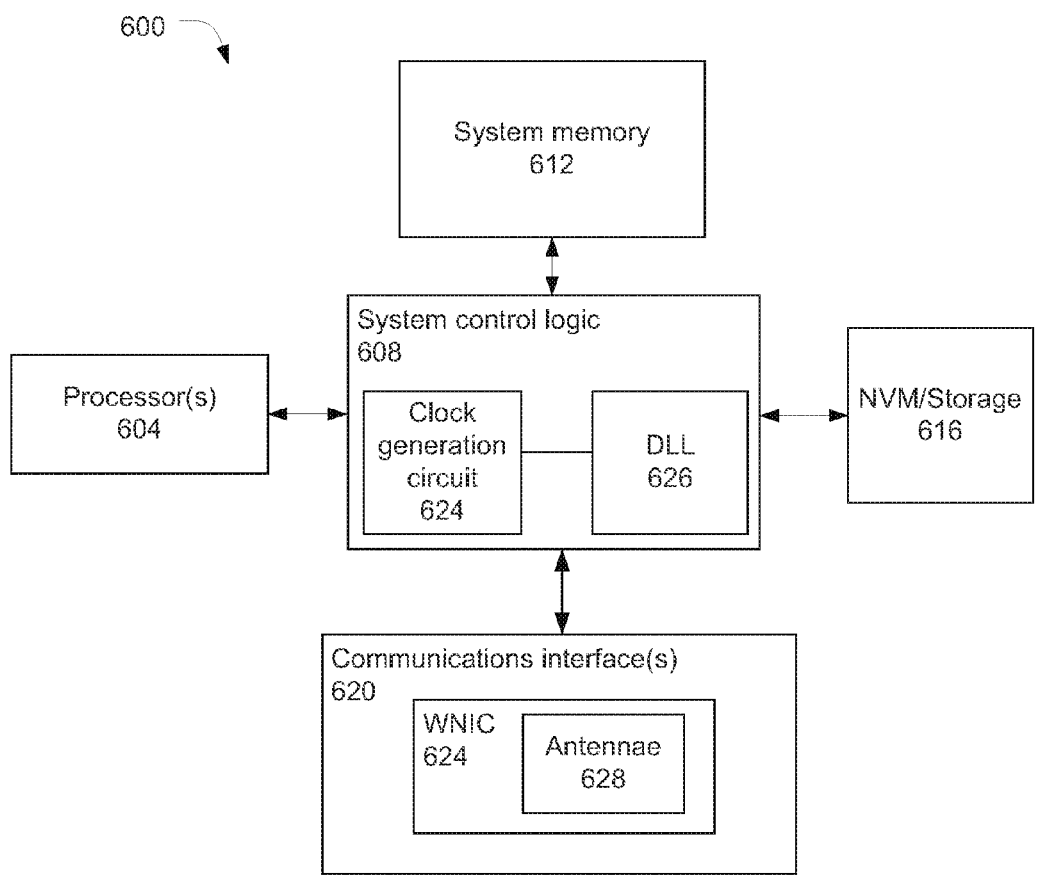
FIG. 6 is a system incorporating a delay-locked loop in accordance with some embodiments.

FIG. 6 illustrates, for one embodiment, an example wireless communication system 600 comprising one or more processor(s) 604, system control logic 608 coupled to at least one of the processor(s) 604, system memory 612 coupled to system control logic 608, non-volatile memory (NVM)/storage 616 coupled to system control logic 608, and one or more communications interface(s) 620 coupled to system control logic 608.

System control logic 608 for one embodiment may include any suitable interface controllers to provide for any suitable interface to at least one of the processor(s) 604 and/or to any suitable device or component in communication with system control logic 608.

System memory 612 may be used to load and store data and/or instructions, for example, for system 600. System memory 612 for one embodiment may include any suitable volatile memory, such as suitable DRAM, for example.

System control logic 608 for one embodiment may include one or more input/output (I/O) controller(s) to provide an interface to NVM/storage 616 and communications interface(s) 620.

The NVM/storage 616 may be used to store data and/or instructions, for example. NVM/storage 616 may include any suitable non-volatile memory, such as flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example.

The NVM/storage 616 may include a storage resource physically part of a device on which the system 600 is installed or it may be accessible by, but not necessarily a part of, the device. For example, the NVM/storage 616 may be accessed over a network via the communications interface(s) 620.

Communications interface(s) 620 may provide an interface for system 600 to communicate over one or more network(s) and/or with any other suitable device. The communications interface(s) 620 may include a wireless network interface controller (WNIC) 624 having one or more antennae 628 to establish and maintain a wireless communication link with one or more components of a wireless network. The wireless communication system 600 may wirelessly communicate with the one or more components of the wireless network in accordance with any of one or more wireless network standards and/or protocols.

The system control logic 608 may include a clock generation circuit 624 that is coupled with a DLL 626, which may be similar to DLL circuit 100. The clock generation circuit 624 may output one or more clock signals, which may be multi-phase clock signals, based on phase outputs from the DLL 626. The clock signals may be provided to one or more of the processors and/or to components of the WNIC 624. In some embodiments, the WNIC 624 may modulate signals to be communicated over a wireless network and/or demodulate signals received from the wireless network based on the multi-phase clocking signal.

For one embodiment, at least one of the processor(s) 604 may be packaged together with logic for one or more controller(s) of system control logic 608. For one embodiment, at least one of the processor(s) 604 may be packaged together with logic for one or more controllers of system control logic 608 to form a System in Package (SiP). For one embodiment, at least one of the processor(s) 604 may be integrated on the same die with logic for one or more controller(s) of system control logic 608. For one embodiment, at least one of the processor(s) 604 may be integrated on the same die with logic for one or more controller(s) of system control logic 608 to form a System on Chip (SoC).

In various embodiments, the system 600 may be, but is not limited to a desktop computing device or a mobile computing device (e.g., a laptop computing device, a handheld computing device, a tablet, a netbook, etc.). In various embodiments, the system 600 may have more or less components, and/or different architectures.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Similarly, memory devices of the present disclosure may be employed in host devices having other architectures. This application is intended to cover any adaptations or variations of the embodiments discussed herein. Therefore, it is manifestly intended that embodiments in accordance with the present disclosure be limited only by the claims and the equivalents thereof.

What is claimed is:

1. A circuit comprising:
   a delay line configured to receive a first signal and to output a delayed version of the first signal, the delay line having a plurality of delay elements serially coupled with one another;
   a drift sensor configured to receive a sensor input signal, which is either the first signal or the delayed version of the first signal, and to selectively output, as a sensor output signal, the sensor input signal or a delayed version of the sensor input signal; and
a phase detector coupled with the delay line and the drift sensor and configured to output a phase detector signal based on a phase relationship between two phase detector input signals.

2. The circuit of claim 1, further comprising:
a state machine coupled with the phase detector, the drift sensor, and the delay line, the state machine configured to:
provide a first control signal to the delay line to adjust an amount of delay provided by the plurality of delay elements, and
provide a second control signal to the drift sensor to control selective output of the sensor input signal or the delayed version of the sensor input signal as the sensor output signal.

3. The circuit of claim 2, wherein the first control signal and the second control signal are digital control signals.

4. The circuit of claim 1, further comprising:
a state machine coupled with the drift sensor and the delay line and configured to lock an amount of delay provided by the delay line and, while the amount of delay is locked, to control the drift sensor to output the sensor input signal, as the sensor output signal, when the phase detector signal is a first value and to output the delayed version of the sensor input signal, as the sensor output signal, when the phase detector signal is a second value.

5. The circuit of claim 1, further comprising:
a state machine coupled with the delay line, the state machine having a counter configured to increment every clock cycle in which the phase detector signal is a first value.

6. The circuit of claim 5, wherein the state machine is configured to:
compare the counter to a threshold value; and
adjust an amount of delay provided by the delay line based on comparison of the counter to the threshold value.

7. The circuit of claim 6, wherein the state machine is configured to incrementally adjust an amount of delay provided by the delay line until the phase detector signal switches from the first value to a second value.

8. The circuit of claim 5, wherein the counter is configured to be decremented every clock cycle in which the phase detector signal has a second value.

9. The circuit of claim 1, wherein the drift sensor comprises a delay element configured to receive the sensor input signal and to output the delayed version of the sensor input signal, wherein a delay provided by the delay element is larger than a least-significant adjustment interval of the delay line.

10. A method comprising:
tracking, while a state machine is in a locked phase, values of a phase detector signal, wherein the values indicate a phase relationship between two phase detector input signals;
outputting a sensor input signal as a first phase detector input signal based on a first value of the phase detector signal and outputting a delayed version of the sensor input signal as the first phase detector input signal based on a second value of the phase detector signal; and
entering a calibration phase, based on said tracking, to adjust a delay provided by a delay line.

11. The method of claim 10, wherein the delay of the delay line is locked while the state machine is in the locked phase.

12. The method of claim 10, further comprising:
providing a delayed version of an oscillator signal as the sensor input signal;
providing the oscillator signal a second phase detector input signal.

13. The method of claim 10, further comprising:
providing a delayed version of an oscillator signal, from the delay line, as a second phase detector input signal; and
providing the oscillator signal as the sensor input signal.

14. The method of claim 10, wherein said tracking comprises:
incrementing a counter every clock cycle in which the phase detector signal has the first value;
comparing the counter to a threshold value; and
entering the calibration phase based on said comparing.

15. The method of claim 10, further comprising:
generating a first digital control signal to adjust the delay provided by the delay line; and
generating a second digital control signal to control a drift sensor to output the sensor input signal or the delayed version of the sensor input signal.

16. A system comprising:
a delay-locked loop (DLL) having:
a delay line having a plurality of delay elements;
a drift sensor configured to selectively output either a sensor input signal or a delayed version of the sensor input signal to facilitate detection of a negative or positive drift in a delay provided by the delay line; and
a plurality of phase outputs respectively coupled with the plurality of delay elements;
a clock generation circuit coupled with the DLL and configured to generate a multi-phase clocking signal based on the plurality of phase outputs; and
a wireless network interface controller coupled with the clock generation circuit and configured to modulate signals to be communicated over a wireless network based on the multi-phase clocking signal.

17. The system of claim 16, wherein the DLL further comprises:
a state machine configured to detect the drift based on a detection that a phase detector signal has a first value for a predetermined number of clock cycles, wherein the first value is indicative of a phase relationship between two phase detector input signals.

18. The system of claim 17, wherein the state machine comprises a counter configured to increment every clock cycle in which the phase detector signal has the first value and to be decremented every clock cycle in which the phase detector signal has a second value.

19. The system of claim 17, wherein the DLL further comprises:
a state machine configured to:
provide a first control signal to the delay line to adjust amount of delay provided by the plurality of delay elements, and
provide a second control signal to the drift sensor to control selective output of the sensor input signal or the delayed version of the sensor input signal as a phase detector input signal.

20. The system of claim 19, wherein the first control signal and the second control signal are digital control signals.

* * * * *